(12) United States Patent
Figov

(10) Patent No.: US 6,927,014 B1
(45) Date of Patent: Aug. 9, 2005

(54) METHOD FOR PRODUCING A DIGITALLY IMAGED SCREEN FOR USE IN A SCREEN PRINTING PROCESS

(75) Inventor: Murray Figov, Raanana (IL)

(73) Assignee: Creo Il Ltd., Herzlia Pituach (IL)

( * ) Notice: Subject to any disclaimer, the term of this patent is extended or adjusted under 35 U.S.C. 154(b) by 450 days.

(21) Appl. No.: 09/980,783

(22) PCT Filed: Jun. 13, 2000

(86) PCT No.: PCT/IL00/00347

§ 371 (c)(1),
(2), (4) Date: Feb. 20, 2002

(87) PCT Pub. No.: WO00/77576

PCT Pub. Date: Dec. 21, 2000

(30) Foreign Application Priority Data

Jun. 14, 1999 (IL) .................................. 130458

(51) Int. Cl.[7] .................................. G03F 7/00
(52) U.S. Cl. .................... 430/302; 430/270.1
(58) Field of Search .............................. 430/270.1, 302, 430/306

(56) References Cited

U.S. PATENT DOCUMENTS

| 5,878,662 A | 3/1999 | McCue |
| 6,341,856 B1 * | 1/2002 | Thompson et al. .......... 347/100 |
| 6,358,668 B1 * | 3/2002 | Leenders et al. ........ 430/271.1 |

FOREIGN PATENT DOCUMENTS

| EP | 0492351 B1 | 7/1992 |
| GB | 2315076 A | 1/1998 |
| WO | WO 97/25206 | 7/1997 |
| WO | WO 98/51750 | 11/1998 |

* cited by examiner

*Primary Examiner*—Amanda Walke
(74) *Attorney, Agent, or Firm*—Edward Langer, Pat. Atty.; Shiboleth, Yisraeli, Robets, Zisman & Co.

(57) ABSTRACT

A method for producing a digital screen printing blank usable in a screen printing process, directly from digital information in the computer, in an economical fashion. In a preferred embodiment, a screen (28) is provided with a photosensitive layer (38), and a digitally determined image from a computer is printed on the screen by means of an inkjet printer. Preferably, a flat bed ink-jet imaging system is used so that the screen can be stretched in a frame and directly placed under the ink-jet head (44). The ink (46) used need not have strong colorant, but functions as a UV mask and thus must contain a UV absorbing pigment. The ink is not absorbed into the photosensitive layer, but remains as an undried image (56) on the surface. The ink must remain wet so that it does not spread and therefore gives a sharp image, and so that the UV absorbent material remains concentrated. The solvent of the ink must be chosen so as to assure that it will not affect the screen. The screen is then irradiated with UV, and the areas which have been printed with ink serve to mask the photosensitive layer from the UV light, while those areas having no ink are exposed so that the photosensitive layer is polymerized by the UV. After the UV irradiation stage, the screen is washed so as to remove the ink and the unpolymerized photosensitive layer. Any liquid that is suitable for washing out the unpolymerized photosensitive layer will also wash away the ink. This leaves the screen with only the polymerized areas of the photosensitive layer that create the blocked areas through which the ink will not pass. Thus, the inventive method provides a digitally imaged screen, directly from a digital image in the computer, which can then be used in any conventional screen printing process.

23 Claims, 7 Drawing Sheets

FIG. 2- PRIOR ART
Direct Method of Producing Screen

FIG. 3 - PRIOR ART
Indirect Method (a)

FIG. 4 - PRIOR ART
Indirect Method (b)

METHOD FOR PRODUCING A DIGITALLY IMAGED SCREEN FOR USE IN A SCREEN PRINTING PROCESS

This application is a 371 of PCT/IL00/00347 filed Jun. 13, 2000.

FIELD OF THE INVENTION

The present invention relates to screen printing methods, and more particularly, to a novel method for the digital production of printing screens using ink jet printing technology.

BACKGROUND OF THE INVENTION

One of the most widely used methods of printing uses a screen. The basis of the screen is a woven thread width a net-like structure of holes. Early screens were fabricated from silk, but partly because of the expense of this material and partly from the point of view of performance, silk has been replaced by nylon, polyester or even metal. The screen is selectively blocked so that ink will pass through only in areas which are necessary to print. Screens come in a variety of mesh openings and thicknesses, depending on the particular application. The screen serves as a support for the blocking material, supporting portions of the blocking material which are unconnected and would otherwise be unsupported. For instance, in printing the letter 'O', in order to allow ink to form the outside of the letter without filling the center, there must be blocking material in the center of the letter. The screen serves to support this center blocking material so that it cannot fall out of the stencil. The screen is tensioned on a frame and ink is pressed onto the stencil with a squeegee so that it is applied to a substrate placed below the screen in those places where it is necessary to print.

The seen printing process is used with inks formulated to adhere to a large variety of surfaces, and the printing process itself can handle a large variety of shapes. This makes screen printing the most versatile of printing processes and it is widely used to print on textiles, packaging, china-ware, glass, plastics, wood and metals, printed circuit boards and posters.

In order to make a screen, it is necessary to prepare artwork, then to photograph it to produce a positive film that in turn can be used to produce the exposed pattern on the photosensitive screen coating. Such original artwork may now be most easily prepared using a computer. The digital information in the computer is then used in an image-setter to produce the positive film. There are a variety of prior art photographic methods of producing the stencil.

In the direct method, solutions of light-sensitive coatings are applied directly onto the screen, then dried and hardened into a printing pattern by exposure to ultraviolet (UV) light through a positive film in which the image areas are opaque to UV light. After exposure, the unexposed, unhardened coating is washed away allowing ink to pass through.

There are other, indirect methods of producing the stencil. The light sensitive coating may be prepared as a pre-sensitized film on an intermediate base. The film can then either be transferred onto the screen before exposure and development or after exposure and development.

There is a growing need in many markets to print low run lengths and print on demand. This is because it is expensive to carry large stocks of pre-printed items and because there is an increasing demand for product customization to the need of individual customers or to relatively small groups of customers instead of mass production. The speed and cost of screen production becomes important and any means of simplifying and reducing costs is advantageous. There is also a trend to use computers to prepare artwork for printing and it would obviously be more convenient if the screen could be prepared directly from the computer information without recourse to the preparation of an intermediate photomask.

Inventors have attempted to use inkjet to produce masks on the screen itself, so that the unimaged, unprotected parts of the screen can be flood-cured by UV radiation. An example of this is described in EP 0 492 351 B1 by Gerber Scientific Products Inc. The problems of ink receptivity of the screen are acknowledged and the preferred method of overcoming these problems is by the introduction of talc onto the surface of the screen, to absorb the ink-jetted ink. This absorbs the liquid medium of the ink, to give a dried graphic. The graphic is described as preferably formed from a water-soluble ink.

Subsequently, similar inkjet integral masks have also been used to produce flexo plates. WO 97/25206 (Polyfibron) describes such a method. The inks used are either solvent based or "phase change". After deposition, the ink is dried by evaporation of the volatile solvent or, in the case of phase change inks, by solidification. After the ink mask is used by flood-exposing the plate with UV light, the image areas are washed out. No mention is made of any difficulties in removing the dry mask after flood exposure, save to point out that inks are useful so long as they can be removed by subsequent washing, without damaging the surface of the plate.

The following later patents recognize the problem of post flooding washout and try to deal with it PCT WO 98/51750 (Markem Corporation) describes such a process. The inks used are "phase change"—known also as hot-melt inks. The ink dries by solidification as it impacts the screen. The patent recognizes the difficulty of removing the solid ink after it had served its purpose as a mask and the inks are formulated to be auto-dispersible in water.

GB 2 315 076 (Sericol) recognizes the same problem when phase change inks are used as integral masks for screen printing. Their solution is to use a water-soluble material having a wax-like texture.

U.S. Pat. No. 5,878,076 (McCue) attempts to circumvent the problem of mask removal after UV flood exposure by depositing only the screen itself by, for instance, inkjet, so that the deposit is in all areas except those of the image. The deposit is then subsequently flood UV-cured from both sides. As a layer of inkjet ink is relatively thin, the patent provides the possibility of multiple passes to achieve the desired screen thickness.

Therefore, it would be desirable to provide a method for screen printing which would not require the production of an intermediate positive film, would allow screen masters to work flow of the printing process, would provide an easily washable ink for forming the mask and would be quicker and more economical to use.

SUMMARY OF THE INVENTION

Accordingly, it is a broad object of the present invention to overcome the problems of the prior art and provide a method of producing a digital screen directly from digital information in the computer in an economical fashion. Specifically, the invention seeks to overcome the problems of providing optimum ink-screen surface interaction to produce a high quality inkjet mask, together with very easy removal of the mask after it has fulfilled its masking function and to provide screen formulations that make this possible.

In accordance with a preferred embodiment of the present invention, there is provided a method of producing a screen using digital imaging, said method comprising the steps of:

providing digital image information from a computer system;

providing an image-ready printing blank comprised of a screen coated with a photosensitive coating that permits aqueous-based inkjet ink to be deposited evenly on its surface and remain in liquid condition;

printing said digital image information in UV-blocking aqueous-based inkjet ink on said photosensitive coating with an ink-jet printer, forming an image structure having exposed and unexposed areas of said photosensitive coating;

flood-curing said photosensitive coating having said formed image structure with UV light such that said exposed areas of said photosensitive coating are cured while said unexposed areas of said photosensitive coating are blocked from UV curing by said UV-blocking ink; and washing said photosensitive coating so that said UV-blocking ink and said unexposed image structure areas are removed, such that the remaining cured areas of said photosensitive coating form a mask on said screen for use in the screen printing process.

In accordance with another aspect of the invention there is provided a screen printing blank usable in a screen printing process said printing blank comprising:

an image-ready printing blank comprised of a screen coated with a photosensitive coating that permits aqueous-based inkjet ink to be deposited evenly on its surface and remain in liquid condition.

In a preferred embodiment, a screen is provided with a photosensitive coating, and a digitally determined image from a computer is printed on the screen by means of an inkjet printer. It is preferable to use a flat bed ink-jet imaging system so that the screen can be stretched in a frame and directly placed under the inkjet head. The ink used need not have strong colorant, but functions as a UV mask and thus must contain a UV absorbing pigment. The ink is not absorbed into the photosensitive coating, but remains as an undried image on the surface. The ink must remain wet so that that it does not spread and therefore gives a sharp image, and so that the UV absorbent material remains concentrated. The screen is then irradiated with UV, and the areas which have been printed with ink serve to mask the photosensitive coating from the UV light, while those areas having no ink are exposed so that the photosensitive coating is polymerised by the UV.

After the UV irradiation stage, the screen is washed so as to remove the ink and the unpolymerised photosensitive coating. Any liquid that is suitable for washing out the unpolymerised photosensitive coating will also wash away the ink. This leaves the screen with only the polymerised areas of the photosensitive coating that create the blocked areas through which the ink will not pass.

Thus, the inventive method provides a digitally imaged screen, direly from a digital image in the computer, which can then be used in any conventional screen printing process.

Other features and advantages of the invention will become apparent from the following drawings and descriptions.

BRIEF DESCRIPTION OF THE DRAWINGS

For a better understanding of the invention with regard to the embodiments thereof, reference is made to the accompanying drawings, in which like numerals designate corresponding elements or sections throughout and in which.

DETAILED DESCRIPTION OF THE INVENTION

The following description begins with a review of prior art methods, shown in FIGS. 1–5.

Figure 1:
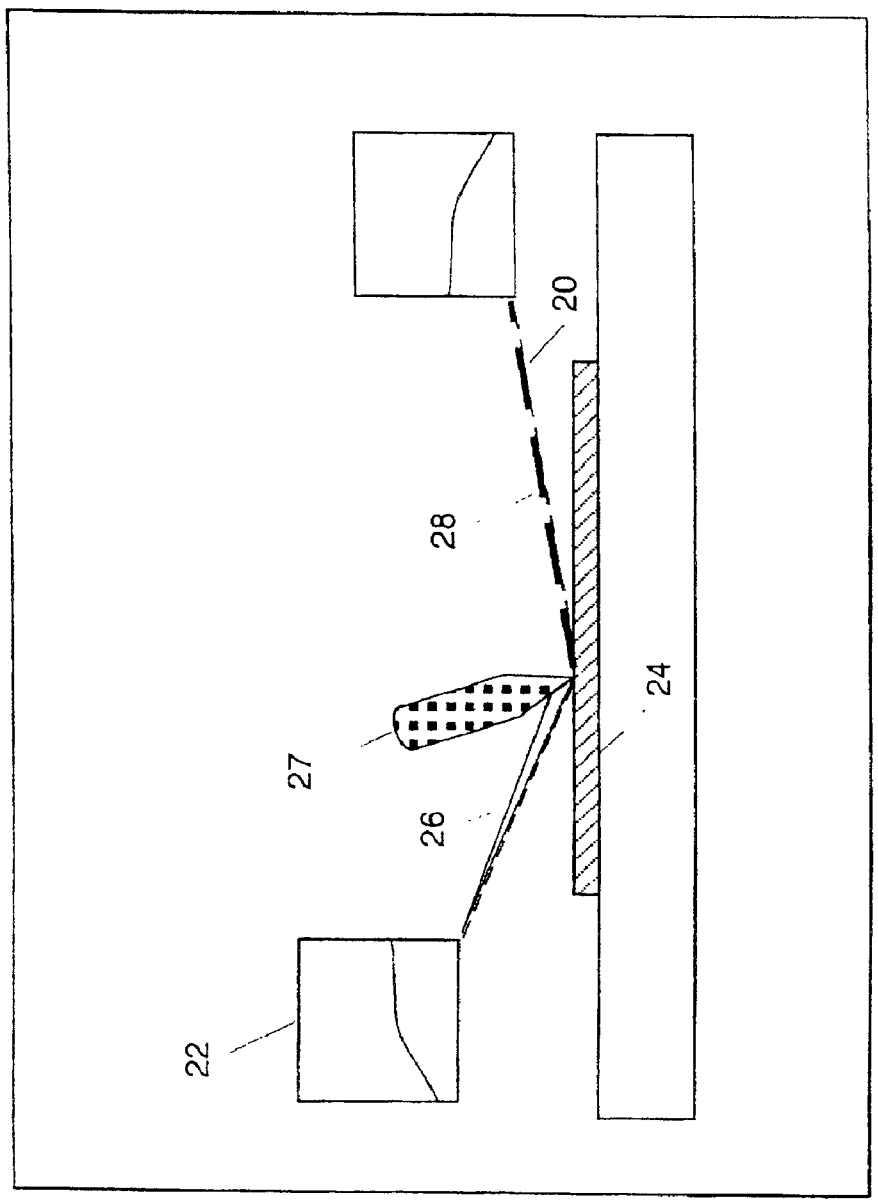
FIG. 1 shows a diagrammatic representation of a prior art method of the silk-screen printing process.

To print in the screen printing method, as shown in prior art FIG. 1, stencil 20 may be used for printing after being tensioned in a metal or wooden frame 22 and having substrate 24 placed beneath it. Stencil 20 must be selectively blocked so that ink 26 can pass through onto the printing substrate 24 only in the areas which are necessary to print. For the simplest type of work, this may be achieved by cutting stencil 20 from a laminated film material and then applying it to screen 28. Ink 26 is pressed onto stencil 20 with squeegee 27 so that ink 26 passes through the unblocked areas of screen 28 onto substrate 24, while ink 26 does not pass through the areas of screen 28 which are blocked by stencil 20.

As mentioned above, the prior art method of producing artwork for silk-screen printing often requires photographing the material. There are a variety of photographic methods of producing stencil 20. A prior art method known as the direct method is shown diagramatically in prior art FIGS. 2a–c. These figures show cross-sectional views of the structures of screen printing stencils.

Figure 2A:
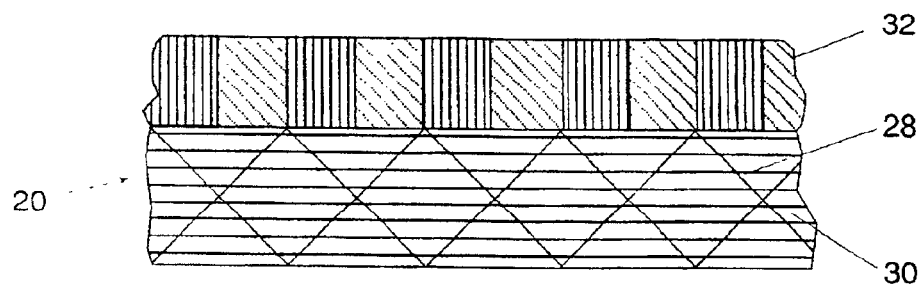
FIGS. 2a–c depict cross-sectional views of the stages of the prior art method of producing a stencil photographically, previously described as the direct method.

As seen in FIG. 2a, stencil 20 is formed by screen 28 to which solutions of light sensitive coatings 30 are applied. Screen 28, represented by cross lines, is filled with photosensitive coatings 30, which are then dried. Positive film 32 is laid on stencil 20. Positive film 32 is comprised of black, UV-opaque image areas and clear, UV-transparent background, or non-image areas, and functions as a UV mask in contact with stencil 20.

Figure 2B:
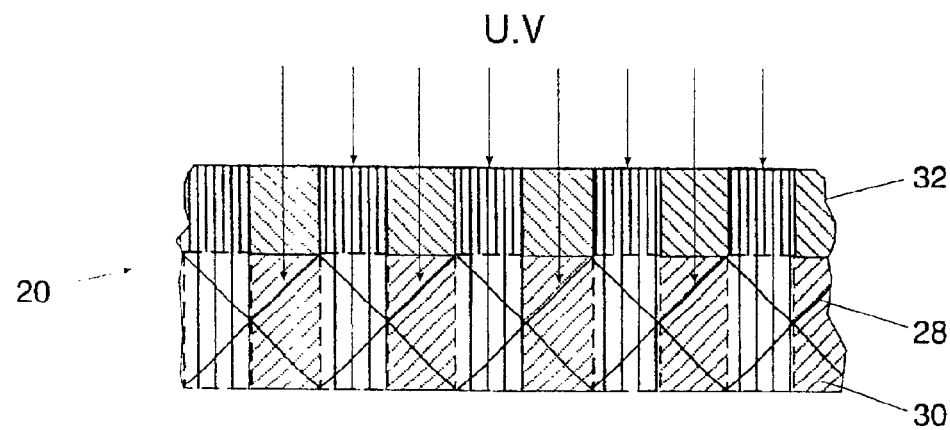

FIG. 2b shows the exposure of the combination of film image 32 and stencil 20 to flood UV light. Coatings 30 are selectively hardened into a printing pattern by exposure to UV light through positive film 32 in which the image areas are opaque to the UV light UV light penetrates film image 32 in the non-image areas and cures the corresponding areas of photosensitive coating 30 creating cured, cross-linked polymeric material 34.

Figure 2C:
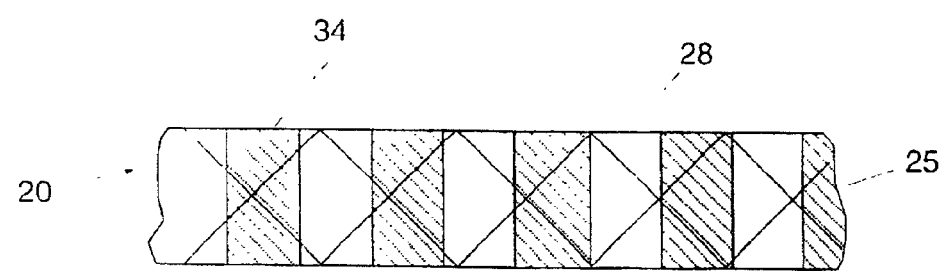

Film image 32 is then physically removed and screen 28 is washed with a solvent which may be water. As seen in FIG. 2c, the washing removes the uncured areas of photosensitive coating 30 leaving only the open woven mesh of screen 28 in these areas, while retaining cross-linked polymeric material 34. Stencil 20 may then be used for printing as described in FIG. 1.

There are other, indirect methods of producing the stencil. The light sensitive coating may be prepared at a pre-sensitized film on an intermediate base. The film can then either be transferred onto the screen before exposure and development or after exposure and development.

Figure 3A:
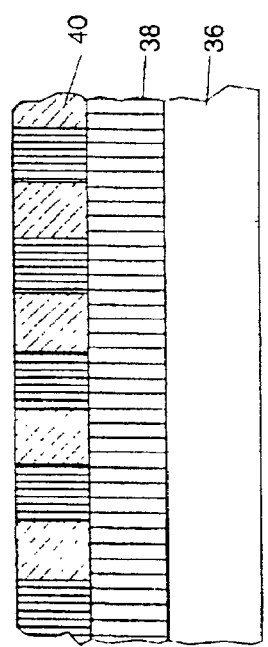
FIGS. 3a–e depict cross-sectional views of the stages of the prior art method of producing a stencil photographically, previously described as an indirect method where transfer from an intermediate material to the screen is done after imaging and washing out.
Figure 3B:
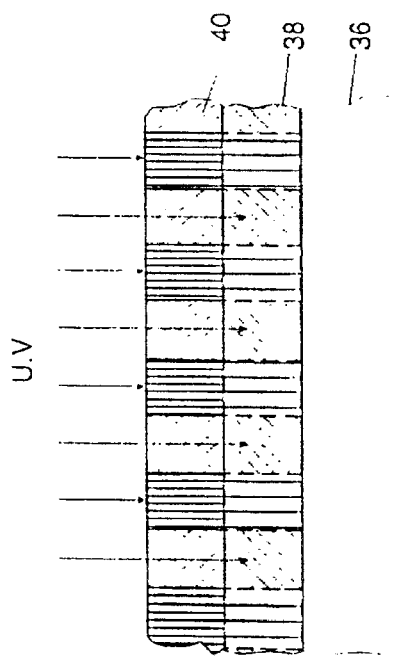
Figure 3C:
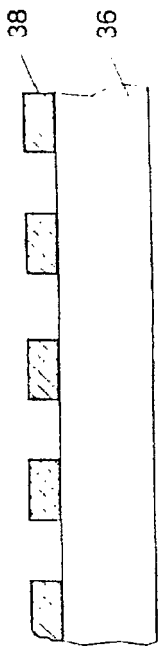
Figure 3D:
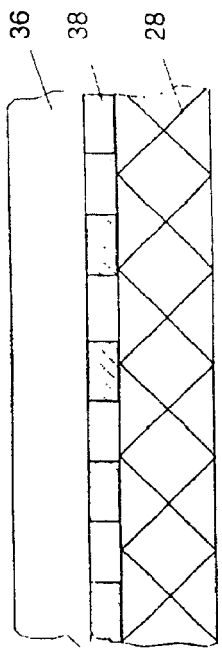
Figure 3E:
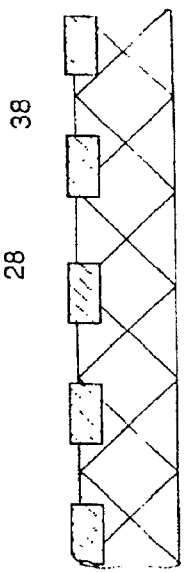

Prior art FIGS. 3a–e show cross-sectional views of an indirect method of transfer from an intermediate material to the screen after the imaging and washing stages. FIG. 3a shows the donor sheet, characteristically a UV transparent substrate 36, comprised of a material such as polyester, coated with a photosensitive coating 38. A positive film serves as photomask 40 and is laid in contact with coating 38. FIG. 3b depicts a UV exposure through photomask 40 onto coating 38. Where the UV is not blocked by photomask 40, coating 38 is hardened by polymerisation. The areas of coating 38 which were directly under the UV opaque areas of photomask 40 remain unaffected. Photomask 40 is then physically removed and the surface of coating 38 is washed, usually with either an organic solvent or a weak alkali solution. This solution washes out the unpolymerised areas, leaving the polymerised areas of coating 38 as depicted in FIG. 3c. Coating 38 is then pressed in contact with screen 28 as shown in FIG. 3d and either by means of pressure, heat or solvent, is transferred to the screen as shown in FIG. 3e, thus providing areas in which the ink is blocked, for the screen printing process.

Figure 4C:
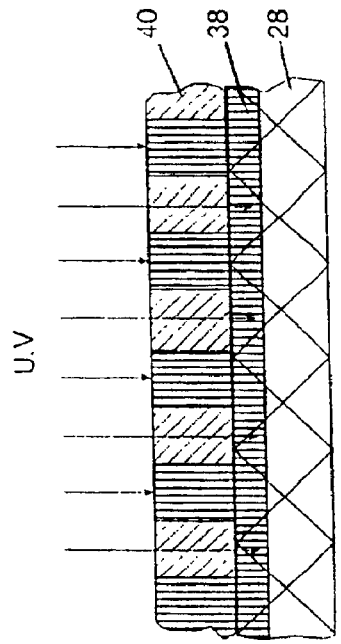
FIGS. 4a–d depict cross-sectional views of the ages of the prior art method of producing a stencil photographically, previously described as an indirect method where transfer from an intermediate material to the screen is done before the imaging and washing stages.
Figure 4D:
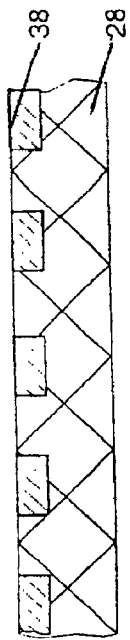
Figure 4A:
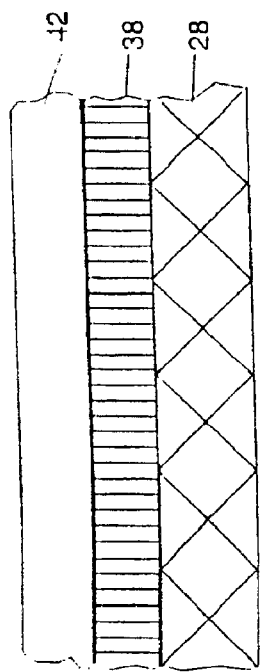
Figure 4B:
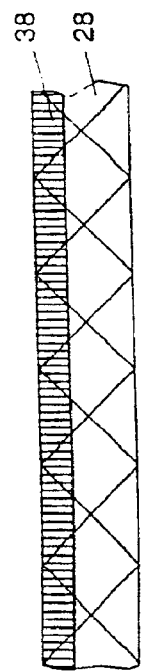

Prior art FIGS. 4a–d describe an indirect transfer process where transfer from an intermediate material to the screen is done before the imaging and washing stages. FIG. 4a shows support 42 coated with photosensitive coating 38 being pressed together with the screen 28, so as to transfer the photosensitive material to screen 28. As in FIG. 3, the transfer may be affected either by heat or pressure or a combination of these, or by solvent, possibly combined with heat and pressure. Support 42 is then physically peeled away and the resulting screen is shown in FIG. 4b. UV flood exposure through photomask 40 is shown in FIG. 4c. This cures the areas which are not blocked by photomask 40. After subsequent washing, as previously described, a print-ready screen results, as shown in FIG. 4d.

Figure 5:
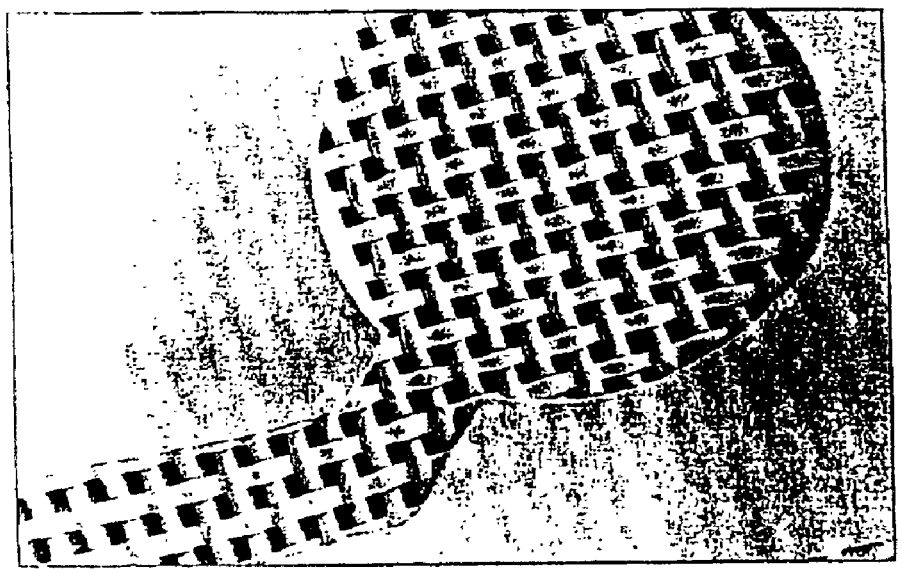
FIG. 5 shows a photosensitive screen stencil which has been imaged and washed out according to one of the above described prior art procedures.

FIG. 5 shows a photosensitive screen stencil which has been imaged and washed according to one of the above described procedures. The image areas show the exposed screen through which ink may pass during printing.

Figure 6A:
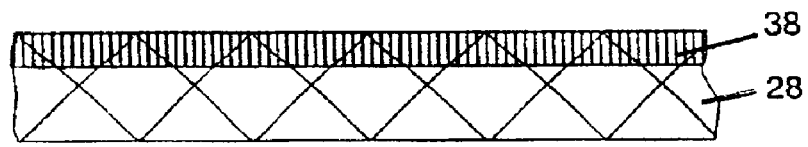
FIGS. 6a–e show cross-sectional views of the steps of the process of producing a stencil, in accordance with the method of the present invention.

Referring now to FIGS. 6a–d, which describe the present invention. FIG. 6a shows screen 28 with a photosensitive coating 38 coated within the screen.

Figure 6B:
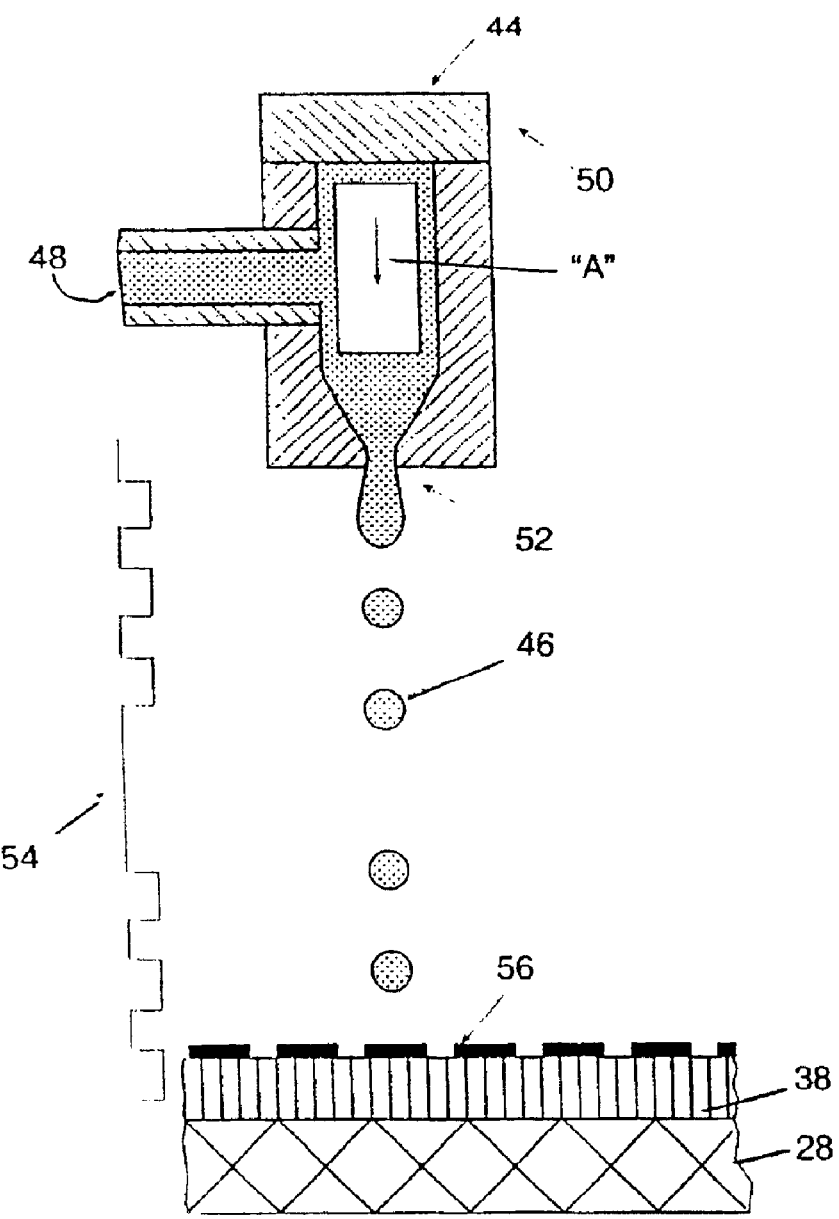

FIG. 6b shows an ink jet head 44 jetting aqueous inkjet ink 46 onto the surface of photosensitive coating 38 of screen 28. The system shown is, by way of example, a generic impulse (drop-on-demand) system, although any type of ink jet system is usable in this invention. In his system, ink supply 48 is delivered at atmospheric pressure. Piezo-electric crystal 50 produces a pressure wave along arrow "A" upon action by an electric signal. This pressure wave causes the ejection of a droplet of inkjet ink 46 from inkjet nozzle 52. A data pulse train 54 produces a pattern of dots as inkjet head 44 traverses the surface of screen 28 depositing image 56.

Thus, inkjet ink 46 is deposited in a pattern that is digitally determined to provide the information directly from a computer that will be printed by the screen by a conventional screen printing process. It is essential to the invention that inkjet ink 46 is not absorbed into the photosensitive coating, but remains as an undried image on the surface. This has various advantages which will be explained below. It is also essential that the surface of photosensitive coating 38 has suitable wetting properties so that when ink droplets 46 impact the surface, they provide smooth, even contact without excessive spreading and without reticulation.

Figure 6C:
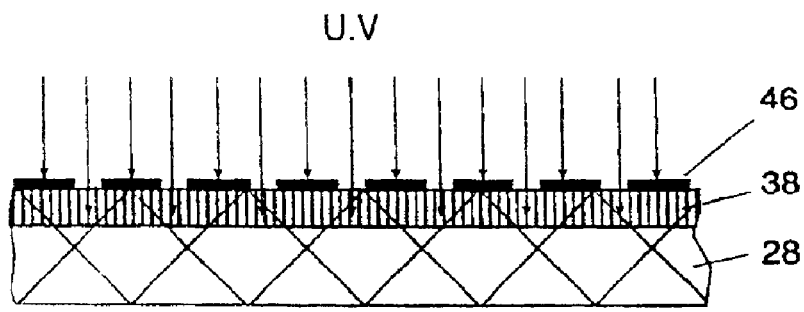

FIG. 6c shows the imaged screen being irradiated with UV radiation. In this case, inkjet ink 46 forms a barrier to the radiation. Preferably, it contains carbon black as the UV absorbing pigment, but dyes or pigments with strong absorption in the UV region may also be used. Ink 46 need have very little actual colorant that is evident to the naked eye, just a sufficient amount to make it visible for following the imaging procedure. The UV absorption function of the dye is more important. As the ink remains wet and is not absorbed into photosensitive coating 38 but remains on the surface, the ink does not spread into coating 38 and therefore gives a sharp image with concentrated pigment or dye or other UV absorbent material. Where there is no inkjet image 56, the radiation polymerizes photosensitive coating 38 and thus reduces its solubility in the developing liquid.

Figure 6D:
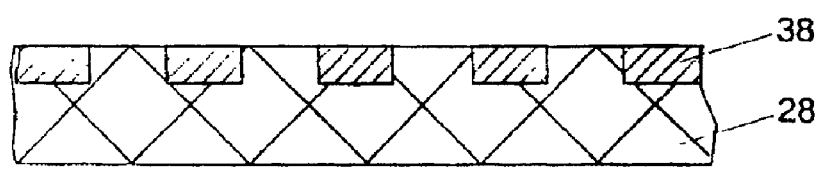

As seen in FIG. 6d, the next stage of the inventive process is to wash out the unpolymerized photosensitive coating 38 together with the ink jet image. Because the inkjet image is wet, it is easily removed by any liquid that is suitable for washing out the uncured coating. Preferred liquids are weak aqueous alkali solutions such as sodium carbonate dissolved in water or mites of water with surfactants and other additives such as organic solvents (generally less than 20% of the developer by weight). This leaves the screen 28 with only the hardened areas of photosensitive coating 38 that create the blocked areas through which ink will not pass.

Figure 6E:
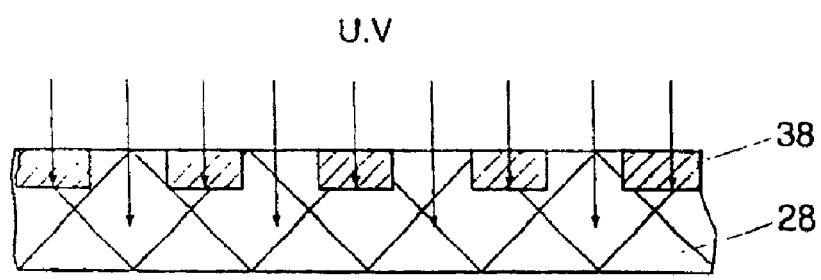

As seen in FIG. 6e, after washing, the screen may undergo a further UV hardening stage to increase resistance to any solvents that may be used in inkjet ink 46.

Generally, it is preferable to have a flat bed ink-jet imaging system so that the screen that is shed in a fame can be directly placed under the ink-jet head. The wet imaged screen is then exposed by transferring the frame so that it resides horizontally below a UV exposure unit that irradiates the surface of the imaged screen from above. Washing of the exposed screen can be accomplished with the solutions recommended by the screen manufacturer.

The preferred type of composition of photosensitive coating 38 has the following three components:

1. Component (A)—between 35% and 75% by weight: UV-curable resins, i.e. oligomers and monomers that can be cross-linked, in the presence of a photoinitiator, by means of irradiation with ultra violet light.
2. Component (B)—up to 10% of the weight of component (A): photoinitiators and synergists that will generate and promote free radicals needed for the cross-linking reaction of component (A).
3. Component (C)—from 10% to 50% by weight: binder resins that must be soluble in water or dilute alkali, as well as in non-aqueous (organic) solvents. It has been found that due to the presence of the binder resin, the surface of the uncured film is particularly suitable for printing with aqueous ink jetinks.

In addition, there are optional ingredients, such as fillers and wetting agents, as well as dyes or pigments to aid visual examination of photosensitive coating 38. The entire mixture may be coated from a non-aqueous solvent directly onto screen 28. Preferably, it is deposited onto a release coating either on paper or film and either in a partially dry state or in a hot and sticky state screen 28 is pressed onto the coating so that after drying and cooling photosensitive coating 38 is absorbed and bonded into the surface of the screen 28 as shown in FIG. 4C. Coating thickness preferably is 20 microns, but can be between 10 microns and 60 microns, in order to obtain maximal difference in solubility between cured and uncured regions and optimise print quality and screen robustness.

The three components of photosensitive coating 38 preferably consist of materials showing suitable duality of solubility in both aqueous and non-aqueous solvents. This would exclude resins such as polyvinyl chlorides, which may be soluble in organic solvents but not in water, and polyvinyl alcohols, which are not soluble in non-aqueous solvents. The resin system used for component (C) must be soluble in organic solvents, so that the monomers and oligomers of component (A), as well as the photoinitiators of component (B), will dissolve easily and, upon application, will yield a compatible dry film. The resins must also have aqueous solubility so that the uncured coating provides suitable inkjet receptivity and can also be washed away, as described below.

Although it would be possible to make a system where the layer is washed away with an organic solvent, this is environmentally not desirable. Examples of types of resins that are useful in the system are Novalaks (functionally substituted phenol-formaldehyde resins), styrene maleic anhydride copolymers, polyvinyl methyl ether/maleic anhydride copolymer and its esters, hydroxy propyl cellulose and esterified rosin-maleic esters and maleic resins with acid values of at least 50.

The following is an example of the components used in screen blank fabrication, imaging and treatment to produce a finished screen.

EXAMPLE I

The following composition was made up (parts by weight) and milled in a ball mill for 2 hours;

| | |
|---|---|
| Methyl Ethyl Ketone | 205 parts |
| Kaolin | 34 parts |
| Ebecryl 150 | 20 parts |
| Cab-O-Sil M5 | 8.6 parts |

After milling, the following ingredients (all parts by weight) were added and stirred in, one by one.

| | |
|---|---|
| Scripset 550 | 21 parts |
| Ebecryl 1259 | 110 parts |
| Alsynol RC 12 | 25 parts |
| Irgacure 184 | 2.8 parts |
| Irgacure 907 | 4.3 parts |
| Speedcure ITX | 1.14 parts |
| BYK 307 | 1.32 parts |
| Sudan Black B | 0.17 parts |

The mixture was bar coated onto a silicone coated release paper. The mixture was air dried for 30 seconds and a commercially available woven polyester fabric suitable for graphics arts printing was pressed onto the coating. As the coating still retained solvent, the polyester fabric penetrated the surface. The sandwich was then dried at 140° C. for 2 minutes to give a dry weight of coating of the above formulation of 25 grams per square meter. By this process, this coating was firmly bonded onto the surface of the polyester fabric.

The coated fabric was then tensioned in a frame and placed on an XY bed where it was imaged using the inkjet printhead described in Patent No. EP640481 assigned to Scitex. The ink used in this head was Epson ink, coded SO20010.

The imaged screen was then exposed to a UV source and then developed by ashing with a solution of the following composition;

| | |
|---|---|
| Deionised water | 1050 g |
| Sodium carbonate | 6.6 g |
| Benzyl alcohol | 12.0 g |
| Sodium lauryl sulphate | 5.4 g |

The washing solution removed the ink as well as the unhardened photopolymeric coating. The screen was then further hardened by UV exposure and could then be used for conventional screen printing.

Sources of Trade Named Raw Material

Alsynol RC12 Rosin-maleic resin estrified with pentaerithritol. Manufactured by DSM 3150 AA Hoek van Holland BYK 307 Polyether modified polydimethyl siloxane. Manufactured by BYK-Gardner GmbH, Geretsried, Germany.

CAB-O-JET 200 Aqueous dispersion of carbon black. Manufactured by Cabot Corporation, Billerca, Mass., US.

Cab-O-Sil M5 Fumed silica. Manufactured by Cabot Corporation, Billerca, Mass., US.

Ebecryl 150 Bisphenol A derivative of diacrylate oligomer. Manufactured by UCB Chemicals, Basle, Switzerland.

Ebecryl 1259 Aliphatic trifunctional urethane acrylate diluted with 35% hydroxy propyl methacrylate. Manufactured by UCB Chemicals, Basle, Switzerland.

Irgacure 184 1-hydroxy-cyclohexyl-phenyl-ketone. Manufactured by Ciba Geigy Corporation, CH4002, Basle, Switzerland Irgacure 907 2-Methyl-1[4-(methylthio)phenyl}-2-morpholino-propan-1-one. Manufactured by Ceba-Geigy Corporation, CH-4002, Basle, Switzerland.

Scripset 550 Secondary butyl ester of styrene-maleic anhydride copolymer. Manufactured by Solutia Europe NV/S.A. Louvain-La-Neuve(Sud), Belgium.

Speedcure ITX Isopropylthioxanthone. Manufactured by Lambson, Castleford, UK.

Sudan Black B Dye. Manufactured by BDH Laboratories, Poole, Dorset, England

Q2-5211 Super-wetting agent. Manufactured by Dow Corporation, Midland, Mich., USA Having described the invention with regard to certain specific embodiments thereof, it is to be understood that the description is not meant as a limitation, since further modifications may now suggest themselves to those skilled in the art, and it is intended to cover such modification as fall within the scope of the appended claims.

What is claimed is:

1. A method of producing a screen using digital imaging, for use in a screen printing process, said method comprising the steps of:

providing digital image information from a computer system;

providing an image-ready printing blank comprised of a screen (28) coated with a photosensitive coating (38) that permits aqueous-based inkjet ink (46) to be deposited evenly on its surface and remain in liquid condition;

printing said digital image information in UV-blocking aqueous-based inkjet ink (46) on said photosensitive coating (38) with an ink-jet printer (44), forming an image structure having exposed and unexposed areas of said photosensitive coating;

flood-curing said photosensitive coating (38) having said formed image structure with UV light such that said exposed areas of said photosensitive coating (38) are cured while said unexposed areas of said photosensitive coating (38) are blocked from UV curing by said UV-blocking ink (44); and washing said photosensitive coating (38) so that said UV-blocking ink (44) and said unexposed image structure areas are removed, such that the remaining cured areas of said photosensitive coating (38) form a mask on said screen (28) for use in the screen printing process.

2. The method of claim 1 further comprising the step of flood-curing said photosensitive coating with UV radiation after said washing step.

3. A method of producing a screen print using digital imaging, said method comprising the steps of:

producing a digitally imaged screen in accordance with the method of claim 1, and using said digitally imaged screen in a screen printing process.

4. The method of claim 1 wherein said ink-jet printer is a flat-bed imaging system.

5. The method of claim 1 wherein said ink-jet printer is part of a generic impulse system.

6. The method of claim 1 wherein said ink-jet printer is part of a continuous ink-jet system.

7. The method of claim 1 wherein said wash is an aqueous alkali solution.

8. The wash of claim 7 wherein said wash comprises aqueous sodium carbonate.

9. The wash of claim 7 wherein said wash comprises less than approximately 20% organic solvents.

10. A screen printing blank usable in a screen printing process, said printing blank comprising:

an image-ready printing blank comprised of a screen (28) coated with a photosensitive coating (38) that permits aqueous-based inkjet ink (46) to be deposited evenly on its surface and remain in liquid condition.

11. The printing blank of claim 10 wherein said photosensitive coating comprises wetting agents.

12. The printing blank of claim 10 wherein said photosensitive coating is between approximately 10 and 60 microns in thickness.

13. The printing blank of claim 10 wherein said photosensitive coating is approximately 20 microns in thickness.

14. The printing blank of claim 10 wherein said photosensitive coating comprises UV-curable resins, photoinitiators, synergists and binder resins.

15. The printing blank of claim 14 wherein said UV-curable resins are present as between approximately 35%–75% by weight of said photosensitive coating.

16. The printing blank of claim 14 wherein said photoinitators and synergists are present as up to approximately 10% of the weight of said UV-curable resins.

17. The printing blank of claim 14 wherein said binder resins are present as approximately 10%–50% by weight of said photosensitive coating.

18. The printing blank of claim 14 wherein said binder resins are soluble in both aqueous and non-aqueous solvents.

19. The printing blank of claim 10 wherein said photosensitive coating comprises at least one of dyes and pigments which are added to aid visual examination of said coating.

20. The printing blank of claim 14 wherein said binder resins include at least one of novalak, styrene maleic anhydride copolymers, polyvinyl methyl ether/maleic anhydride copolymer and its esters, hydroxy propyl cellulose and esterified rosin-maleic esters, and maleic resins with acid values of at least 50.

21. The printing blank of claim 10 wherein said ink remains wet during the imaging process and is not absorbed into said photosensitive coating.

22. The printing blank of claim 10 wherein said ink is comprised of carbon black.

23. The printing blank of claim 10 wherein said ink is comprised of a UV absorbing pigment or dye.

* * * * *

UNITED STATES PATENT AND TRADEMARK OFFICE
CERTIFICATE OF CORRECTION

PATENT NO. : 6,927,014 B1
DATED : August 9, 2005
INVENTOR(S) : Murray Figov

It is certified that error appears in the above-identified patent and that said Letters Patent is hereby corrected as shown below:

Column 1,
Line 17, should be -- with -- and not "width".
Line 37, should be -- screen -- and not "seen".

Column 2,
Line 34, should have a period after "it" and before "PCT".

Column 3,
Line 62, should be -- directly -- and not "direly".

Column 5,
Line 63, should be -- this -- and not "his".

Column 6,
Line 36, should be -- mixtures -- and not "mites".
Line 45, should be -- stretched in a frame -- and not "shed in a fame".

Column 7,
Line 7, should have a period after "state", and "Screen" should be capitalized.

Column 8,
Line 14, should be -- washing -- and not "ashing".

Column 9,
Lines 43 and 45, should be -- the method of claim 7 -- and not "the wash of claim 7".

Signed and Sealed this

Sixth Day of December, 2005

JON W. DUDAS
*Director of the United States Patent and Trademark Office*